United States Patent [19]

Hämäläinen

[11] 4,228,539

[45] Oct. 14, 1980

[54] HIGH FREQUENCY TRANSMITTER

[75] Inventor: Reijo Hämäläinen, Vantaa, Finland

[73] Assignee: Valsala Oy, Finland

[21] Appl. No.: 973,797

[22] Filed: Dec. 28, 1978

[51] Int. Cl.² .................. H04B 1/03; H03H 13/00
[52] U.S. Cl. ............................ 455/124; 331/97;
 331/101; 331/117 D; 333/224; 333/232
[58] Field of Search ............. 325/105, 171, 125, 127,
 325/128, 129, 130; 331/96–98, 101, 102, 117 D;
 334/41, 45, 43; 333/222–224, 226, 231, 232

[56] References Cited
U.S. PATENT DOCUMENTS

| 2,248,227 | 7/1941 | Gantet | 333/226 |
| 2,837,722 | 6/1958 | Goublin-Korsten et al. | 333/226 |
| 4,039,982 | 8/1977 | Weldon | 325/171 |

*Primary Examiner*—Marc E. Bookbinder
*Attorney, Agent, or Firm*—Steinberg & Blake

[57] ABSTRACT

The components of a transistor oscillator are mounted on an end cap rotatably mounted on the outer tube of a cavity resonator which stabilizes the oscillator. The intensity with which a high frequency is applied to the cavity resonator is adjustable by rotation of the end cap.

7 Claims, 5 Drawing Figures

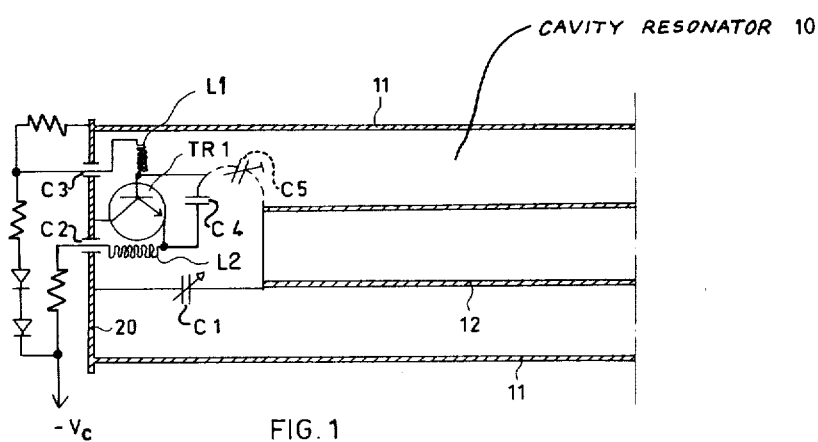
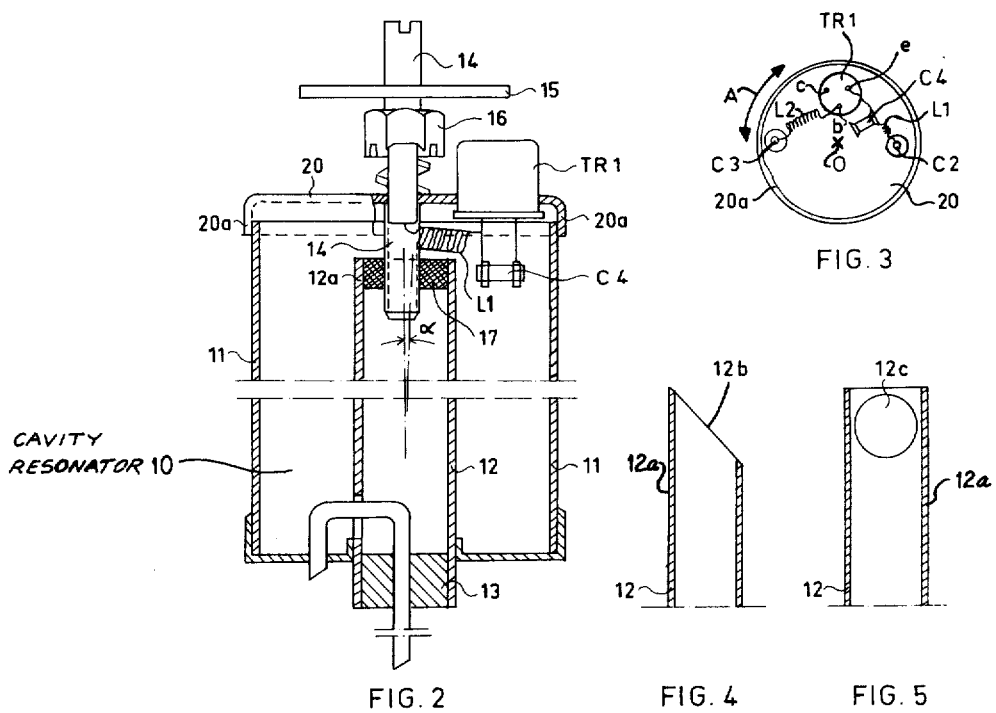

4,228,539

HIGH FREQUENCY TRANSMITTER

BACKGROUND OF THE INVENTION

The present invention relates to a high frequency transmitter. More particularly, the invention relates to a high frequency transmitter for use in radiosondes. The transmitter of the invention includes a transistor oscillator stabilized by a cavity resonator.

SUMMARY OF THE INVENTION

The principal object of the invention is to provide a high frequency transmitter, particularly for use in radiosondes, which is as simple as possible in structure and inexpensive in manufacture.

An object of the invention is to provide a high frequency transmitter which may be tuned simply and with facility and ease.

Another object of the invention is to provide a high frequency transmitter in a frequency range of 400 to 1600 MHz.

Still another object of the invention is to provide a high frequency transmitter which is adjustable to eliminate the influence of the variation of the properties of various components such as, for example, transistors, to insure the start-up of the oscillator of the transmitter under all conditions, and to stabilize the output frequency of such oscillator.

Yet another object of the invention is to provide a high frequency transmitter having a structure which is simple, but strong enough from the point of view of the conditions of use.

In accordance with the invention, the aforestated objects are attained by installing the components of the oscillator in a gable part or end wall or cap rotatably mounted on the end of the outer tube of a cavity resonator. The intensity, closeness or tightness with which a high frequency is applied to the cavity resonator is made adjustable by rotation of the end cap or gable part.

BRIEF DESCRIPTION OF THE DRAWINGS

For a fuller understanding of the invention, reference is had to the following description, taken in connection with the accompanying drawings, in which:

FIG. 1 is an electrical circuit diagram of the oscillator of the high frequency transmitter of the invention and of the connection between the transmitter and the cavity resonator;

FIG. 2 is a sectional view of an embodiment of the high frequency transmitter of the invention;

FIG. 3 is a view, on a reduced scale, of the undersurface of the gable part of the resonator of the high frequency transmitter of the invention;

FIG. 4 is a sectional view of an embodiment of the end of the center tube of the resonator of the high frequency transmitter of the invention; and FIG. 5 is a sectional view of another embodiment of the end of the center tube of the resonator of the high frequency transmitter of the invention.

DESCRIPTION OF PREFERRED EMBODIMENTS

The high frequency transmitter is intended to be used in a meteorological radiosonde, and comprises a transistor oscillator stabilized at a 4000 MHz frequency range by a cavity resonator 10. The oscillator is basically a Clapp oscillator, which is a modified Colpitts oscillator.

The principal circuitry of the oscillator is shown in FIG. 1.

The intrinsic parasitic reactances of a transistor TR1 and the stray connections between components C1, C2, C3, C4, L1 and L2 of the oscillator are used to produce and maintain oscillation.

The adjustable or variable capacitor C1, shown in FIG. 1, has an influence mainly on the vibration frequency. Physically, the variable capacitor C1 is a set screw 14 located in the middle of the end cap or gable part 20 of the outer tube 11 of the cavity resonator 10, as shown in FIGS. 1 and 2. The depth of penetration of the screw 14 into the center tube or tubular center lead 12 of the cavity resonator 10 is adjustable.

In accordance with the invention, the intensity, closeness or tightness of the coupling or connection between the transistor TR1 and the resonator 10 is made adjustable in order to, among other things, eliminate the influence of the variation of the properties of said transistor, to insure the start-up of the oscillator, and to stabilize the output power and frequency of the transmitter. The coupling or connection is represented by a capacitance C5, shown in a broken line connection in FIG. 1.

The mechanical structure of the high frequency transmitter of the invention comprises the cavity resonator 10. The resonator 10 has the cylindrical outer tube 11 and the inner center tube 12. The resonator 10 has a terminal 13 (FIG. 2) through which the output power of the transmitter may be applied to an antenna. The end cap or gable part 20 is provided at the other, opposite, end of the resonator 10. As shown in FIGS. 2 and 3, the end cap or gable part 20 is a cap-formed gable plate fitting tightly on the end of the outer tube 11 of the cavity resonator 10. The gable plate 20 has a peripheral edge section 20a fitting tightly on the outer tube 11 (FIG. 2).

In accordance with the invention, the electrical components C2, C3, C4, L1, L2 and TR1 of the oscillator are mounted on the end cap or gable part 20. The adjustable or variable capacitor C1 comprises the adjustable screw 14, the inner end of which is inserted in the end 12a of the center tube or tubular inner lead 12 and is surrounded by an annular member or part 17 of electrically insulative material of any suitable type. A jam nut 16 is affixed to the adjustable screw 14 outside the outer tube 11. The other components of the oscillator and possibly some of the aforementioned components, as well as connections with other parts, are provided by a circuit card 15. The base of the circuit card 15 is affixed to the adjustable screw 14. The transistor TR1 is mounted in a hole in the gable plate 20.

An essential feature of the invention is the manner of accomplishing the adjustment of the coupling or connection capacitance C5. In accordance with the invention, no separate adjusting capacitor or condenser is required, since the connection is between the end of the center tube or lead 12 of the cavity resonator 10 and the feedback capacitor or condenser C4. The transistor TR1 is mounted in the gable part 20 of the outer tube 11, so that the position of the condenser C4, connected between the base and emitter electrodes of said transistor, is adjustable in relation to the asymmetrical end 12a of the center tube 12. The position of the condenser C4 is adjusted by rotating the gable part 20 about its axis 0, as indicated by an arrow A in FIG. 3. The proper position of the gable part 20 may be verified by measuring the current absorbed by the oscillator and adjusting it at a certain level.

As shown in FIG. 2, the end 12a of the center tube 12 is asymmetrical relative to the condenser C4 and to the other electrical components. This is accomplished by making the center tube 12 noncentric in relation to the axis of the outer tube 11. This noncentricity is indicated by an angle α in FIG. 2. Thus, when the end cap 20 is rotated about its axis 0, the condenser C4 is moved closer to, or farther from, the end 12a of the inner tube 12 thereby varying the coupling or connection capacitance C5, produced as stray capacitance.

As shown in FIG. 4, the center tube 12 is made asymmetrical by chamfering its end 12a at 12b. As shown in FIG. 5, the center tube 12 is made asymmetrical by forming a hole 12c through its end 12a. The end 12a may be made asymmetrical by a plurality of bores, cutouts, or the like.

The invention is by no means restricted to the aforementioned details which are described only as examples; they may vary within the framework of the invention, as defined in the following claims.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A high frequency transmitter comprising a cavity resonator having an outer tube having spaced opposite ends, a coaxial inner tube spaced from and surrounded by the outer tube and an end cap coaxially rotatably mounted on said outer tube at one end thereof; and a transistor oscillator stabilized by the cavity resonator and having components mounted on the end cap of said resonator whereby the intensity with which a high frequency is applied to said resonator is adjustable by rotation of said end cap.

2. A high frequency transmitter as claimed in claim 1, wherein said end cap of said resonator has a peripheral edge abutting said outer tube of said resonator and fits tightly on said outer tube.

3. A high frequency transmitter as claimed in claim 1, wherein said inner tube of said resonator has an end adjacent said end cap which is asymmetrical relative to the axis of said outer tube thereby facilitating adjustability of the intensity with which a high frequency is applied to said resonator.

4. A high frequency transmitter as claimed in claim 1, wherein said oscillator includes a variable capacitor for adjusting the vibration frequency of said oscillator, said variable capacitor comprising an adjustable screw inserted in said inner tube of said resonator at an end of said inner tube in the area of said end cap.

5. A high frequency transmitter as claimed in claim 3, wherein the high frequency is applied principally via stray reactance between said end of said inner tube and said oscillator.

6. A high frequency transmitter as claimed in claim 3, wherein said end of said inner tube is chamfered.

7. A high frequency transmitter as claimed in claim 3, wherein said end of said inner tube has a bore formed therethrough.

* * * * *